United States Patent
Wu et al.

(10) Patent No.: US 10,386,718 B2
(45) Date of Patent: Aug. 20, 2019

(54) METHOD FOR MODELING A PHOTORESIST PROFILE

(71) Applicant: Synopsys, Inc., Mountain View, CA (US)

(72) Inventors: Cheng En Wu, Hsinchu (TW); Haiqing Wei, San Jose, CA (US); Qiaolin Zhang, Sunnyvale, CA (US); Hua Song, San Jose, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/789,948

(22) Filed: Jul. 1, 2015

(65) Prior Publication Data

US 2016/0012175 A1    Jan. 14, 2016

Related U.S. Application Data

(60) Provisional application No. 62/023,551, filed on Jul. 11, 2014.

(51) Int. Cl.
*G06F 17/50* (2006.01)
*G03F 7/004* (2006.01)

(52) U.S. Cl.
CPC ................... *G03F 7/0045* (2013.01)

(58) Field of Classification Search
CPC . G03F 7/705; G03F 7/168; G03F 7/26; Y10T 428/24479
USPC .................... 716/50–55; 430/5, 30
See application file for complete search history.

(56) References Cited

U.S. PATENT DOCUMENTS

| | | | | |
|---|---|---|---|---|
| 5,889,686 A | * | 3/1999 | Mimotogi | G06F 17/5018 257/336 |
| 5,999,720 A | * | 12/1999 | Inui | G03F 7/38 703/13 |
| 8,910,093 B2 | * | 12/2014 | Flagello | G03F 7/705 716/50 |
| 9,733,576 B2 | * | 8/2017 | Smith | G03F 7/705 |
| 2007/0282574 A1 | * | 12/2007 | Huang | G03F 7/705 703/2 |
| 2012/0079436 A1 | * | 3/2012 | Flagello | G03F 7/705 716/55 |

OTHER PUBLICATIONS

Sean Burns, The Effect of Electrostatic Surface Charger on Photoresist Dissolution, Apr. 2000, pp. 1-28.*

* cited by examiner

*Primary Examiner* — Nghia M Doan
(74) *Attorney, Agent, or Firm* — Alston & Bird LLP

(57) ABSTRACT

A computer-implemented method includes modeling, using the computer, a photoresist profile in accordance with a magnitude of a gradient of an inhibitor concentration disposed in the photoresist. The photoresist is used during a process to form an integrated circuit. In one embodiment, the computer-implemented method further includes applying the modeled photoresist profile to reduce a distortion in a printed photoresist pattern caused by a response of the photoresist to an electromagnetic wave and/or particle beam during the process.

24 Claims, 5 Drawing Sheets

| 502 CHARACTERIZING A PHOTORESIST PROFILE IN ACCORDANCE WITH A MAGNITUDE OF A GRADIENT OF AN INHIBITOR CONCENTRATION DISPOSED IN THE PHOTORESIST |

METHOD FOR MODELING A PHOTORESIST PROFILE

CROSS-REFERENCES TO RELATED APPLICATION

The present application claims benefit under 35 USC 119(e) of U.S. Provisional Application No. 62/023,551, titled "METHOD FOR MODELING A PHOTORESIST PROFILE", filed Jul. 11, 2014, the contents of which is incorporated herein by reference in its entirety.

BACKGROUND

The present invention relates generally to a method and system for computer aided design (CAD) of integrated circuits and in particular to characterizing a photoresist profile.

Much of the contemporary high-tech industry, with the electronics industry in particular, rests on advances in semiconductor device manufacturing, especially the micro-lithography technology. Modern semiconductor chip design and lithography practices increasingly rely upon computer simulation-based techniques, collectively called computational lithography, which uses a "mathematical model" for process development, analysis, characterization, refinement, and implementation.

There are two simultaneously desired but often contradictory needs for most computational lithography applications. One need is a reliable and accurate mathematical model that properly captures the pertinent physical and/or chemical processes, often in precise numerical agreement with the physical results. The other, need is that the same mathematical model should be amenable to efficient numerical algorithms to manipulate a large amount of design and/or process data with limited computational resources in a short turnaround time.

SUMMARY

In accordance with one embodiment of the present invention, a computer-implemented method includes characterizing, using the computer, a photoresist profile in accordance with a magnitude of a gradient of an inhibitor concentration disposed in the photoresist. According to one embodiment, the computer-implemented method further includes characterizing, using the computer, the photoresist profile in accordance with the inhibitor concentration.

According to one embodiment, the inhibitor concentration includes an exponential function of a photo-acid concentration disposed in the photoresist. According to one embodiment, the computer-implemented method further includes characterizing, using the computer, the photoresist profile in accordance with the inhibitor concentration raised to a power of n, wherein n is a real number greater than or equal to 5. According to one embodiment, the computer-implemented method further includes applying the characterized photoresist profile to reduce a distortion in a printed photoresist pattern caused by a response of the photoresist to an electromagnetic wave and/or particle beam.

According to one embodiment, the computer-implemented method further includes characterizing the photoresist using the computer. The characterization is defined by a threshold of an inhibitor disposed in the photoresist that is equal to at least the sum of a first term and a second term. The first term includes an inhibitor concentration and the second term includes a magnitude of the gradient of the inhibitor concentration.

According to one embodiment, the second term includes the product of the magnitude of the gradient of the inhibitor concentration multiplied by the inhibitor concentration raised to a power of n, wherein n is a real number greater than or equal to 5. According to one embodiment, the first term includes an exponential function of a photo-acid concentration disposed in the photoresist. According to one embodiment, the second term includes the sum of a third term and a fourth term. According to one embodiment, the third term includes the product of the magnitude of the gradient of the inhibitor concentration multiplied by the inhibitor concentration raised to a power of n, wherein n is a real number greater than or equal to 5.

In accordance with one embodiment of the present invention, a non-transitory computer-readable storage medium includes instructions which when executed by a computer cause the computer to characterize a photoresist profile in accordance with a magnitude of a gradient of an inhibitor concentration disposed in the photoresist. According to one embodiment, the instructions further cause the computer to characterize the photoresist profile in accordance with the inhibitor concentration.

According to one embodiment, the instructions further cause the computer to characterize the photoresist profile in accordance with the inhibitor concentration raised to a power of n, wherein n is a real number greater than or equal to 5. According to one embodiment, the instructions further cause the computer to apply the characterized photoresist profile to reduce a distortion in a printed photoresist pattern caused by a response of the photoresist to an electromagnetic wave and/or particle beam.

According to one embodiment, the instructions further cause the computer to characterize the photoresist. The characterization is defined by a threshold of an inhibitor disposed in the photoresist that is equal to at least the sum of a first term and a second term. The first term includes an inhibitor concentration and the second term includes a magnitude of the gradient of the inhibitor concentration.

In accordance with one embodiment of the present invention, a system is configured to characterize a photoresist profile in accordance with a magnitude of a gradient of an inhibitor concentration disposed in the photoresist. According to one embodiment, the system is further configured to characterize the photoresist profile in accordance with the inhibitor concentration.

According to one embodiment, the system is further configured to characterize the photoresist profile in accordance with the inhibitor concentration raised to a power of n, wherein n is a real number greater than or equal to 5. According to one embodiment, the system is further configured to apply the characterized photoresist profile to reduce a distortion in a printed photoresist pattern caused by a response of the photoresist to an electromagnetic wave and/or particle beam.

According to one embodiment, the system is further configured to characterize the photoresist. The characterization is defined by a threshold of an inhibitor disposed in the photoresist that is equal to at least the sum of a first term and a second term. The first term includes an inhibitor concentration and the second term includes a magnitude of the gradient of the inhibitor concentration.

A better understanding of the nature and advantages of the embodiments of the present invention may be gained with reference to the following detailed description and the accompanying drawings.

DETAILED DESCRIPTION

Embodiments of the present invention address such stringent modeling and computational needs for simulating, using a computer, the lithographic photoresist chemistry, including the process steps of photo-exposure, resist baking and then development. A compact mathematical model is desired to represent the complex nonlinear responses of photoresist, hereinafter also referred to as "resist," both accurately and efficiently. The number of modeling terms should be minimized in order to achieve good numerical efficiency, which however imposes a challenge to model completeness, namely, a compact model should have enough terms and varieties of terms to fully capture the multitude of physical and or chemical parameters and mechanisms involved in the complex process. Described below are a method and embodiments of physically rationalizing modeling terms for compact models of photoresist, where the mathematical forms of rationalized modeling terms are derived preferably from physical considerations and mathematical analyses, which also incorporate adjustable and physically meaningful parameters that can be calibrated using measured data. The method of physical rationalization has the advantage of improving model accuracy and numerical efficiency while minimizing the number of modeling terms. "Physically rationalizing" and "physical rationalization" refer to the method and steps of deriving modeling terms in a compact and succinct mathematical form with adjustable and physically meaningful parameters, based on physical considerations and mathematical analyses.

In the field of computational lithography, it may be an important yet difficult task to model or simulate the behavior and response of the photoresist and process, which may be in contrast to the step of optical image formation in the photoresist film, which has well understood physics and is described rigorously by a set of linear transformation equations that afford well established and efficient solutions or approximations. The difficulty of modeling photoresist stems from the very nonlinear and dispersive dynamics of chemical reaction and diffusion, compounded by the again very nonlinear and non-local response of photoresist development.

Figure 1:
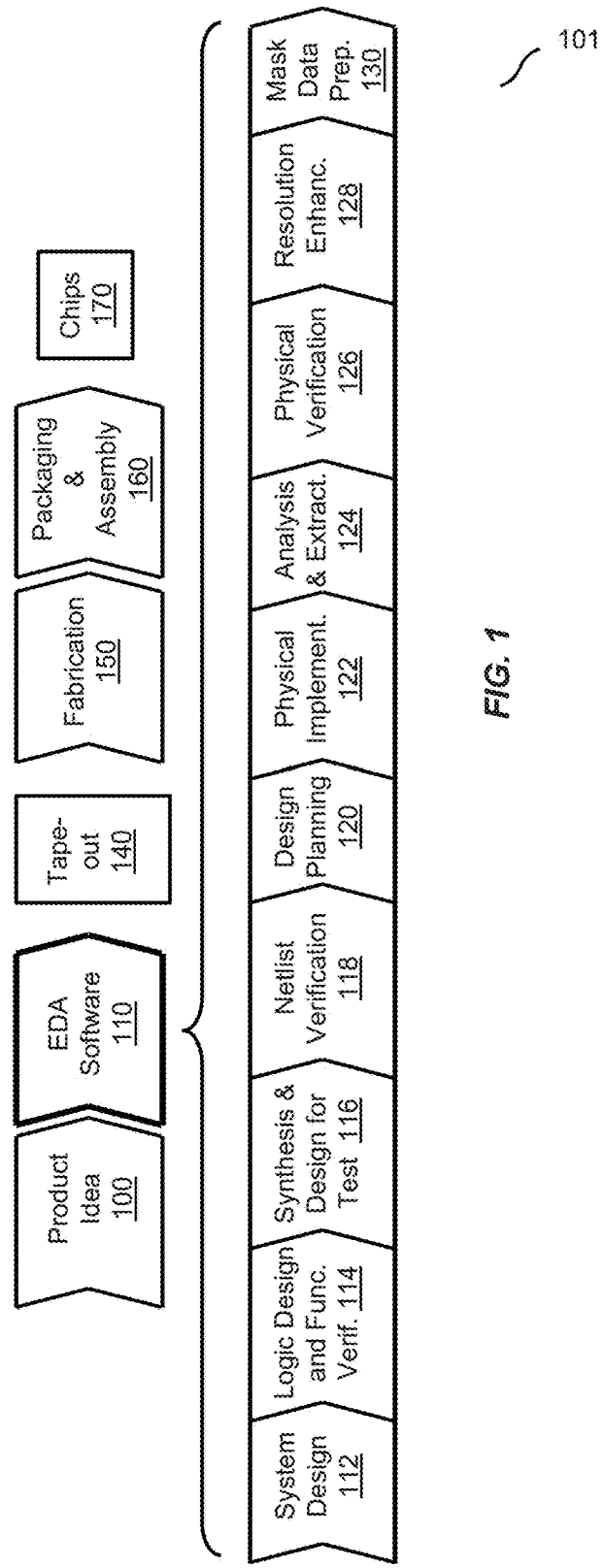
FIG. 1 depicts simplified exemplary steps in the design and fabrication of an integrated circuit that may use embodiments of the present invention.

FIG. 1 depicts simplified exemplary steps 101 in the design and fabrication of an integrated circuit that may use embodiments of the present invention. The process starts with a product idea 100, which is realized using Electronic Design Automation (EDA) software 110. Chips 170 can be produced from the finalized design by performing fabrication 150 and packaging and assembly 160 steps. An exemplary design flow that uses EDA software 110 is described below for illustration purposes only. For example, an actual integrated circuit design may require a designer to perform the design flow steps in a different sequence than the sequence described below.

In the system design 112, a designer describes the functionality to be implemented. The designer can also perform what-if planning to refine the functionality and to check costs. Further, hardware-software architecture partitioning can occur at this step. In the design and functional verification 114, a Hardware Description Language (HDL) design may be created and checked for functional accuracy.

In the synthesis and design 116, the HDL code can be translated to a netlist, which can be optimized for the target technology. Further, tests can be designed and implemented to check the finished chips. In the netlist verification 118, the netlist can be checked for compliance with timing constraints and for correspondence with the HDL code. In the design planning 120, an overall floor plan for the chip can be constructed and analyzed for timing and top-level routing. Next, in the physical implementation 122, placement and routing can be performed.

In the analysis and extraction 124, the circuit functionality can be verified at a transistor level. In the physical verification 126, the design can be checked to correct any functional, manufacturing, electrical, or lithographic issues. In the resolution enhancement 128, geometric manipulations can be performed on the layout to improve manufacturability of the design. Finally, in the mask data preparation 130, the design can be taped-out 140 for production of masks to produce finished chips. The embodiments of the present invention may be used, for example in conjunction with other EDA tools at the steps of either physical verification 126 and/or mask data preparation 130. For example, embodiments of the models of photoresist processing presented herein may be used along with mask layout data when the computer is invoked to simulate the resulting pattern in the photoresist after exposure, post exposure bake and development during the semiconductor process flow. In one embodiment, the results of this photoresist computer modeling, which may include a characterized photoresist profile, may be applied to reduce a distortion in a printed photoresist pattern caused by a response of the photoresist to an electromagnetic wave and/or a particle beam. In one embodiment, the distortion may be reduced by adjusting the layout pattern. In another embodiment, the distortion may be reduced by changing the characteristics of the photoresist process.

Embodiments of the present invention present a method of representing the behavior and response of photoresist by a compact model consisting of physically rationalized modeling terms, which is amenable to rapidly convergent parameter calibration with measured data and is well suited for fast simulations over the entire surface area of a large semiconductor chip. In one embodiment, the method starts from a first step of identifying essential mechanisms and parameters that affect and contribute to the variations of the final results of developed photoresist critical dimensions (CDs) and topography profile. In a second step the underlying physics and chemistry of each essential mechanism is analyzed, identifying the signal excitation-response relationship and the governing mathematical equations. Next, a third step uses techniques of mathematical analysis including dimensional, scaling, and asymptotic analyses, extracting compact, descriptive, and parameterized modeling terms that capture the relationship between the essential mechanisms and parameters that affect the final results of developed photoresist. Finally, the method concludes with a fourth step of incorporating the modeling terms into a general model form.

As a result of the four steps described above, the obtained general model form constitutes a compact model that consists of physically rationalized modeling terms. Naturally, the compact model itself becomes very much physical, in comparison to known mostly empirical model forms. One immediate advantage of the physics-based model forms derived in accordance with the four steps described above is better model stability under uncertainties or fluctuations of conditions and parameters of the modeled process, and relatedly, stronger predictive power when the models are extrapolated into process conditions and parameters outside the regions where they are calibrated, in comparison to known mostly empirical model forms. Another significant advantage of using physically rationalized modeling terms is that they tend to afford the most compact and parsimonious model form as a manifestation of "Occam's razor", which helps to minimize the number of modeling terms and facilitates more efficient numerical solutions for both model calibrations and model simulations than known mostly empirical model forms.

Traditionally, computational lithography simulations over large areas of semiconductor chips employ the so-called compact model forms, which evaluate a two- or three-dimensional signal field S modeled as a function of the photo-mask layout pattern, an optical object $O(x,y)$, and various other process parameters collectively denoted by P, which incorporates and lumps effects of a multitude of process steps. A constant threshold $S_{th}$ is customarily applied to extract predicted (or simulated) contours or CDs of developed resist pattern or topography. Effectively, a compact model of computational lithography based on a compact model form $S[O(x,y), P]$ solves an equation:

$$S_{th} = S[O(x,y), P], \quad (1)$$

in order to produce the desired contour or CD predictions.

The multitude of process steps incorporated and lumped in a compact model form usually include optical imaging and photoresist chemistry. In the earliest compact models, the thresholding operation was meant to represent the effects of photoresist chemistry in its entirety, so the signal field was simply the optical intensity modeled as a quadratic form of the optical object:

$$I(x,y) = \langle O(x,y) | TCC(P) | O(x,y) \rangle \quad (2)$$

where the potentially P-dependent TCC is a linear operator corresponding to the so-called transmission cross coefficients. Sometimes a linear functional of $O(x,y)$, namely a convolution of $O(x,y)$ with a kernel function $K(x,y)$, is added to the signal field to capture certain pattern density-dependent effects, such as optical flare. Optical flare may be caused by the random scattering of light by irregularities on the photo-mask, dusts on the pellicle, and inherent microscopic density fluctuations in the glass materials of optical lenses. Furthermore, the optical intensity is often blurred by a suitable diffusion kernel $G(x,y)$ to qualitatively represent the effects of photo-acid diffusion in the processed photoresist, ultra-violet (UV) source laser bandwidth, and/or stage vibration-induced blurring. The model equation thus becomes:

$$I_{th} = G(x,y)*I(x,y) + K(x,y)*O(x,y), \quad (3)$$

with $I(x,y)$ defined in equation (2) above.

As lithography technology has advanced, both the photoresist CDs and the simulation error tolerance have reduced greatly making it necessary to model the photoresist response more accurately and in greater details. In particular, it may no longer be adequate to simply threshold the optical intensity for predictions of photoresist contours and CDs, such as for example in equation (3). Therefore, there is a need to supplement the baseline results of thresholding the optical intensity with corrections to the predicted photoresist profiles/contours/CDs, or conversely to the signal field, in order to bring the simulated and the physical photoresist profile results on the wafer to better agreement. Thresholding the optical intensity owes its usefulness to the very nonlinear and sharply transitioning photoresist development response, even though the development response is not an ideal sigmoid, i.e., strictly thresholding. Consequently, the past has seen a slew of "variable threshold" compact models in the general form of:

$$S_{th} = G(x,y)*I(x,y) + K(x,y)*O(x,y) + \Delta S[I(x,y)], \quad (4)$$

where $\Delta S$ is a functional of the optical intensity $I(x,y)$, and a shorthand for typically a collection of modeling terms associated respectively with the absolute value of the slope, the second-order derivatives (e.g., the Laplacian), and other derived quantities of the signal field $I(x,y)$. Such $\Delta S[I(x,y)]$ has been referred to as a "variable threshold", and equation (4) has been called a "variable threshold" model form, because, effectively, $\Delta S[I(x,y)]$, when moved to the left-hand side of equation (4), amounts to adjusting the threshold level at each specific location (x,y), in accordance with the signal distribution in its spatial neighborhood.

In later known techniques, such "variable threshold" compact model evolved slightly, to employ a substantially predetermined ad-hoc empirical mathematical expression for $\Delta S[I(x,y)]$, namely, a predetermined model form, where a typical known recipe involves using a number of predetermined mathematical kernels from a set of orthogonal basis functions, convolving the signal $I(x,y)$ with each of the predetermined mathematical kernels, and finally forming a linear combination of the convolution results weighted by tunable coefficients to represent the "variable threshold" $\Delta S[I(x,y)]$. In a sense, the "convolution with predetermined mathematical kernels" approach generalizes the previous method that involves explicit derivatives of the signal field, because derivatives may be approximated by convolutions with suitable kernels.

The above-mentioned "variable threshold" of known compact models are empirical in nature, where the introduction and selection of the predetermined mathematical kernels are not based on specific physical/chemical steps, mechanisms, or parameters, rather, they are largely arbitrary and mostly out of mathematical or numerical convenience, reflecting merely, in a broad sense, the empirical observation that the developed resist contours or CDs are not completely determined by the on-site optical intensity, but show dependence on the signal distribution in a spatial neighborhood. Such known empirical "variable threshold" models have worked in the past for multiple generations or technology nodes of semiconductor manufacturing technology. But the empirical nature of such known models severely limits the model stability under uncertainties or fluctuations of conditions and parameters of the modeled process and curtails the model predictive power when extending to process conditions and parameters outside the regions where the models are calibrated. The empirical models often require greatly more measurement data to calibrate, and the calibration procedure takes too long to converge or does not converge at all, because the model optimizer has to search for the optimal solution over a very high-dimensional parameter space that is filled with "local optimum traps" or undesired solutions.

Fundamentally, mathematical completeness is a serious issue with empirical models. For linear systems, there is the theoretical guarantee of model completeness, namely, any linear (and shift-invariant) system can be approximated to a predetermined degree of accuracy by a linear combination of signal convolutions, so long as the convolution kernels are from a complete set of orthogonal basis functions and a sufficient number of convolution kernels are included in the linear combination as a model form. Unfortunately, it is well known that the photoresist response is dispersive and highly nonlinear, which is not well approximated by a linear transformation followed by thresholding. As a remedy, low-order powers as well as low-order cross-products of convolution results have been added to empirical "variable threshold" models. However, the low-order nonlinearity in the resulted empirical model forms cannot faithfully represent the dispersive and highly nonlinear photoresist response. On the other hand, when the allowed order of powers and cross-products of the convolution results rises, the empirical models suffer an exponential explosion of model complexity, in terms of the number of modeling terms alone, which quickly cripple computations during the computer simulation of such empirical compact models.

Figure 2:
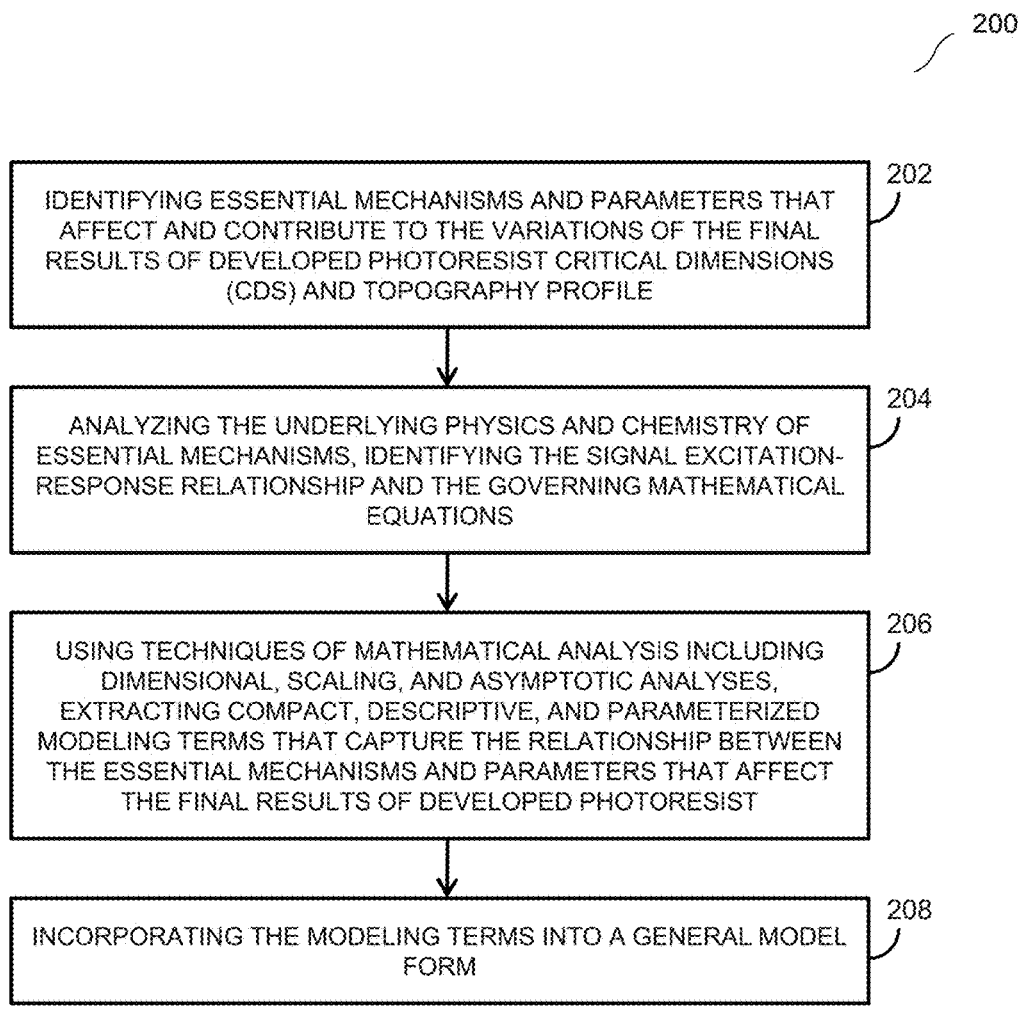
FIG. 2 depicts a simplified flowchart to derive a general model form that includes physically rationalized modeling terms, in accordance with one embodiment of the present invention.

To overcome the limitations and shortcomings of empirical compact models, one embodiment of the present invention provides a general method and procedure to construct and utilize physics-based model forms comprising physically rationalized modeling terms. The desired model form can be a general mathematical function of a combination of physically rationalized model terms, but each of these modeling terms may be deduced from considerations and analyses of one or more specific physical/chemical step(s), mechanism(s), and parameters associated with the physical photoresist. FIG. 2 depicts a simplified flowchart to derive a general model form that includes physically rationalized modeling terms, in accordance with one embodiment of the present invention. The flowchart may include four generalized steps. In the first step, essential mechanisms and parameters are identified 202 that affect and contribute to the variations of the final results of developed photoresist critical dimensions (CDs) and topography profile;

In the second step, the underlying physics and chemistry of most essential mechanisms are analyzed 204, and the signal excitation-response relationship and the governing mathematical equations are identified, In the third step, techniques of mathematical analysis, including dimensional, scaling, and asymptotic analyses, are used to extract compact, descriptive, and parameterized modeling terms that capture the relationship between the essential mechanisms and parameters that affect the final results of developed photoresist. In the fourth step, the modeling terms are incorporated into a general model form. In one preferred embodiment, the general form is a linear combination of the modeling terms. In another preferred embodiment, the general model form consists of products of the modeling terms.

Obtained from the described four-step procedure is a general physics-based compact model that consists of physically rationalized modeling terms. In contrast to the traditional empirical models, the generated physics-based models achieve much improved model stability under uncertainties or fluctuations of conditions and parameters of the modeled process, and have stronger predictive power when extrapolated into process conditions and parameters outside the regions where the physics-based models are calibrated. Furthermore, there is a significant advantage of using physically rationalized modeling terms, in that the number of modeling terms tends to be minimized while the compact model maintains the fitting and predictive power to properly characterize the true physical and/or chemical behavior of the photoresist, because each modeling term corresponds to a true underlying physical and/or chemical step or mechanism, and all essential underlying physical and/or chemical steps or mechanisms have a corresponding and representative modeling term in the model form. Compactness and parsimony are important benefits of the physics-based compact model with physically rationalized modeling terms, which translate immediately to higher numerical efficiency for solving computational problems of model calibrations and model simulations compared to known empirical compact models.

In the above-described four-step procedure, it is important to identify correctly the essential mechanisms and parameters that affect the results of developed photoresist, and apply proper techniques of mathematical analysis to extract compact, descriptive, and parameterized modeling terms. In many underlying physical and/or chemical steps and mechanisms, the signal excitation-response relationship follows mathematically simple and familiar power scalings, exponential laws, Gaussian convolutions, primitive additions and multiplications. With applications of suitable techniques of mathematical analysis, such as dimensional, scaling, and asymptotic analyses, it often happens that the extracted modeling terms are also in such mathematically simple forms of powers, exponentials, Gaussian convolutions, primitive additions and multiplications, which inspire intuitive and appealing interpretations and facilitate efficient computing.

In one preferred embodiment, the dissolution inhibitor, hereinafter also referred to as "inhibitor," concentration or density M(x,y), or the concentration or density of another physical or chemical ingredient that controls the dissolution rate of the photoresist material during the development process, disposed in the photoresist after the photo-exposure and post-exposure bake (PEB) physical process steps is chosen as the model signal field, and the model form reads:

$$M_{th}=M(x,y)+\Delta M(x,y), \qquad (5)$$

where $M_{th}$ is a constant threshold applied to the model signal field to extract predicted or simulated contours or CDs of the developed resist pattern or topography, i.e. a thresholding operation, and where $\Delta M(x,y)$ represents a collection of modeling terms called "variable biases". Equation (5) chooses the inhibitor density M(x,y) as the model signal field, because both the photo-exposure and the PEB steps are treated rigorously, or nearly rigorously, via whole-field signal processing algorithms. Therefore in one embodiment, the computer-implemented method includes characterizing, using the computer, the photoresist profile in accordance with the inhibitor concentration disposed in the photoresist. Photoresist may further include photo-acid generators and quenchers responsive to electromagnetic radiation such as ultra-violet light or electron beams. The photo-exposure step may be treated as an exponential depletion of photo-acid generators and creation of photo-acids as explained in further detail below. The photo-acid and quencher base reaction-diffusion process may be well approximated by a "split step" algorithm, where each "split step" is either "diffusion only without nonlinearity" or "nonlinear only without diffusion", both of which are amenable to efficient computer computation.

Figure 3:
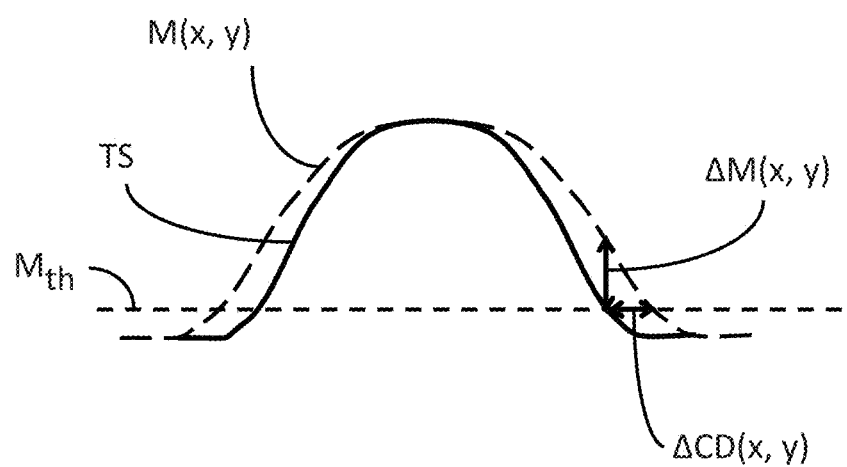
FIG. 3 depicts the inhibitor concentration M(x,y) as the model signal field, the total signal with the development bias modeling term incorporated, and the relationship between the development CD bias and the inverted model signal bias, in accordance with one embodiment of the present invention.

What remains besides M(x,y) in equation (5) is the step of photoresist development, which lacks a rigorous numerical algorithm, and has to be represented by a physically rationalized modeling term as a "variable bias", naturally named the development bias. Due to the non-ideal-thresholding response of photoresist development, it may be assumed that the actual developed photoresist CD or contour would deviate from the prediction of directly thresholding the inhibitor concentration M(x,y), with the deviation ΔCD(x,y), called development CD bias, depending on the inhibitor distribution in the spatial neighborhood of (x,y). Since the model form is based on an equation of the inhibitor concentration M(x,y), it is necessary to invert the development CD bias ΔCD(x,y) into a modeling term of variable signal bias ΔM(x,y). The specific mathematical form of the modeling term is physically rationalized as follows. FIG. 3 depicts the inhibitor concentration M(x,y) as the model signal field, the total signal with the development bias modeling term incorporated, and the relationship between the development CD bias, ΔCD(x,y), at the level of the constant threshold $M=M_{th}$, and the inverted model signal bias, in accordance with one embodiment of the present invention. First, as shown in FIG. 3, small changes of the concerned quantities, e.g. inhibitor concentration, are related by their differentials providing:

$$\Delta M(x,y) = |\nabla M(x,y)| \times \Delta CD(x,y), \quad (6)$$

which in other words is the change needed to the inhibitor model to get the resist process model signal. FIG. 3 further depicts the total signal, TS=M(x,y)+ΔM(x,y).

Figure 4:
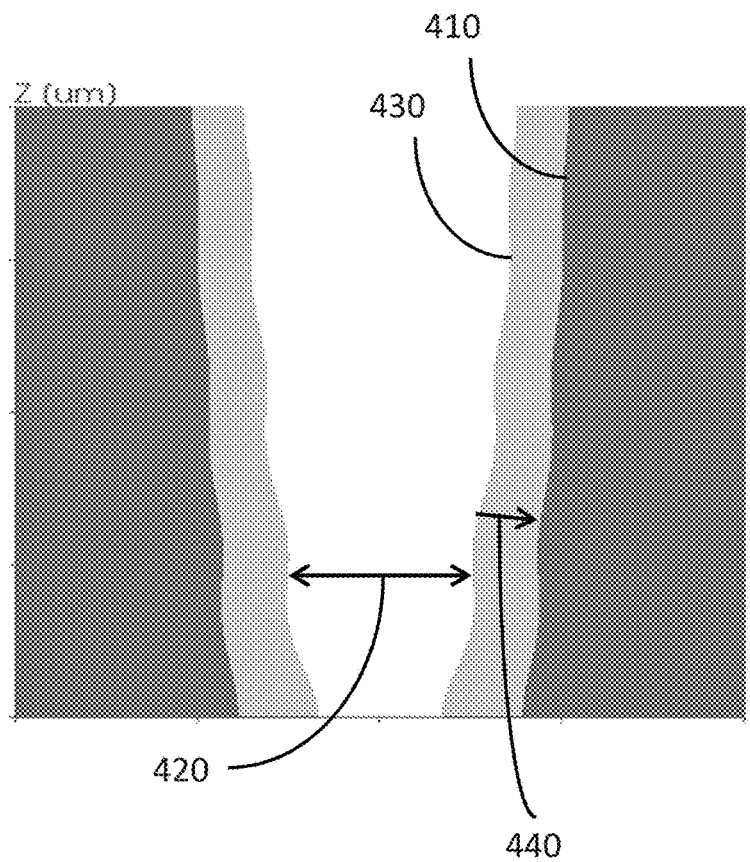
FIG. 4 depicts a cross-section of developed resist profile that may use embodiments of the present invention.

Second, due to the highly nonlinear nature of the photoresist development rate R[M(x,y)] as a function of the inhibitor concentration M(x,y), and the relatively high contrast between the maximum $R_{max}$ and the minimum $R_{min}$ of development rates, even for the negative tone development (NTD) photoresists, it is observed experimentally that the quickly developable region of photoresist dissolves into the developer rather rapidly within one to a few seconds, while the developer spends the majority of the development time, the remaining tens of seconds, to advance only a little in the "development resistant" region of the photoresist, creating a relatively small development CD bias ΔCD(x,y), which is approximately:

$$\Delta CD(x,y) = R[M(x,y)] \times \Delta T, \quad (7)$$

with ΔT being most of the development time, thus substantially the same and independent of the lithography patterns. FIG. 4 depicts a cross-section of developed resist profile that may use embodiments of the present invention, where the dark grey color represents the "development resistant" region of the photoresist 410. The white and gapped region 420 represents the quickly developable portion of the photoresist or in other words the CD given by the pure inhibitor threshold model or the pure optical model. The relatively narrow light grey-colored layer 430 experiences slow development and consumes the majority of the development time, with the arrow representing the portion of the development path 440 that is within the layer 430.

Finally, according to the Mack development model, the development rate can be modeled by:

$$R(M) = R_{max} \frac{(a+1)(1-M)^n}{a+(1-M)^n} + R_{min}, \quad (8)$$

for a positive tone development (PTD) resist, and given by:

$$R(M) = R_{max} \frac{(a+1)M^n}{a+M^n} + R_{min}, \quad (9)$$

for an NTD photoresist, where α is a constant related to the threshold $M_{th}$ and n is the development reaction order parameter. For an NTD photoresist and α»1 in particular, the development rate is asymptotically given by:

$$R(M) \approx R_{max} M^n + R_{min}, \quad (10)$$

which scales as M raised to the nth power. Combining all results of the asymptotic, dimensional, and scaling analyses, a physically rationalized modeling term of variable bias is obtained to represent the effect of development bias:

$$\Delta M(x,y) = C \times |\nabla M(x,y)| \times [M(x,y)]^n \quad (11)$$

with C and n being calibration parameters. The physical rationalization also informs that C is related to the product $R_{max}\Delta T$ and n is related to the development reaction order. Therefore in one embodiment, the computer-implemented method includes characterizing, using the computer, the photoresist profile in accordance with the inhibitor concentration raised to a power of n, wherein n is a real number greater than or equal to 5.

Figure 5:
FIG. 5 depicts a flowchart for characterizing a photoresist profile in accordance with a magnitude of a gradient of an inhibitor concentration disposed in the photoresist, in accordance with embodiments of the present invention.

Experimental measurements and modeling practices have shown that the development reaction order n is generally a large number, which may be generally measured between 5 to 30. Here the power of physically rationalized modeling terms can be well appreciated, in terms of representing so succinctly an extremely highly nonlinear (n ≥5) and dispersive (M(x,y) incorporates the effects of photo-acid and quencher diffusion) response. It is very difficult to incorporate modeling terms up to such high-order of nonlinearity and dispersion using an empirical model. FIG. 5 depicts a flowchart for characterizing, using the computer, a photoresist profile in accordance with a magnitude of a gradient of an inhibitor concentration disposed in the photoresist, in accordance with embodiments of the present invention, as described by equations (5), (6), and (11) above.

In another embodiment, the inhibitor density M(x,y) itself in equation (5) is physically rationalized into compact modeling terms, by physically and mathematically analyzing the photo-exposure and PEB steps. In one analysis, the photo-exposure step is approximated as a linear transform from the optical intensity I(x,y) to the photo-acid concentration, $H(x,y) = C_{Dill}I(x,y)$, where $C_{Dill}$ is the "Dill C" parameter. Then the PEB step is approximated by an instantaneous neutralization with constant quencher base concentration $B_0$, followed by convolutions of the "clipped" photo-acid and quencher concentrations with Gaussian kernels $G_H(x,y)$ and $G_B(x,y)$ respectively representing the effects of diffusion, and lastly another instantaneous neutralization of the diffused photo-acid and quencher. Therefore, the final photo-acid concentration reads:

$$H(x,y) = \max\{G_H(x,y) * \max[C_{Dill}I(x,y) - B_0, 0] - G_B(x,y) \\ * \max[B_0 - C_{Dill}I(x,y), 0], 0\}. \quad (12)$$

The continuously on-going process of chemically amplified inhibitor de-blocking is then rationalized into a single exponential dependence as:

$$M(x,y)=\exp[-C_{CAR}H(x,y)]=\exp[-C_{CAR}\times\max\{G_H(x,y) \\ *\max[C_{Dill}I(x,y)-B_0,0]-G_B(x,y)*\max[B_0-C_{Dill}I(x,y),0],0\}], \quad (13)$$

where $C_{CAR}$ is a parameter proportional to the reaction rate of the chemically amplified inhibitor deblocking process. Alternatively, the "Dill C" photo-exposure step is treated rigorously to get an initial photo-acid concentration:

$$H_0(x,y)=[PAG]\{1-\exp[-C_{Dill}I(x,y)]\}, \quad (14)$$

where [PAG] is the concentration of the photo-acid generator. The diffusion, acid-base neutralization, and chemical amplification processes are treated with the same physical rationalizations as above, so to obtain:

$$H(x,y)=\max\{G_H(x,y)*\max[H_0(x,y)-B_0,0]-G_B(x,y) \\ *\max[B_0-H_0(x,y),0],0\}, \quad (15)$$

and $$M(x,y)=\exp[-C_{CAR}H(x,y)]=\exp[-C_{CAR}\times\max\{G_H(x,y) \\ *\max[H_0(x,y)-B_0,0]-G_B(x,y)*\max[B_0-H_0(x,y),0],0\}]. \quad (16)$$

Note that the physically rationalized modeling term of M(x,y) in equation (13) or (16) is highly nonlinear and dispersive, i.e., subject to heavy diffusion, therefore rather unlikely to appear in a traditional empirical model with a prescribed model form without physical rationalization. On the other hand, physical rationalization renders the modeling term of M(x,y) in equation (13) or (16) rather compact with a small number of tunable parameters and amenable to efficient computerized numerical algorithms.

In one embodiment, the experimentally observed effect of photo-decomposable quencher (PDQ) that is disposed in the photoresist is identified, and the physical rationalization of a corresponding modeling term is derived as follows. As the photo-decomposable quencher absorbs light energy and becomes decomposed, the photo-decomposition products are assumed inactive and not to affect the photo-acid and the relevant chemical reactions. In particular, the photo-decomposed quencher loses the capability to neutralize photo-acids. Therefore, in brightly exposed regions where a high concentration of photo-acid is generated, the PDQ is also largely decomposed and depleted, so there is less quencher remaining to neutralize the photo-acid. Conversely, in less exposed regions where the photo-acid concentration is only low, the photo-decomposition of quencher is also weak, so there is more quencher concentration remaining to efficiently annihilate the minority of photo-acid. The net effect is an enhanced contrast of the chemical latent image.

There are multiple options of physically rationalized modeling terms to represent such nonlinear contrast enhancement effect. One option is to clip the photo-acid latent image following Dill's formula of photo-exposure by a suitable threshold value, and neglect the photo-acid altogether in regions below the threshold, under the physical rationalization that a low-level concentration of photo-acid is completely overwhelmed by a high initial concentration of quencher base. Only for regions with a photo-acid concentration above the threshold, the photo-acid is assumed to overcome the depleted quencher base concentration and actively catalyze the inhibitor de-blocking while diffusing in space. Another option is to simply square the photo-acid latent image, or raise the photo-acid concentration to a power greater than 1.

The essential physical rationalization of each option above representing nonlinear contrast enhancement effect may be to incorporate a nonlinear, e.g. super-linear, scaling of the photo-acid concentration against the optical intensity, in order to represent and approximate the nonlinear enhancement of contrast, due to the photo-decomposition of quencher in conjunction with the canonical process of photo-acid generation. Still another option is to treat the photo-decomposition of quencher in the rigorous "Dill C" manner, such that the quencher concentration is no longer a constant as in equation (12) or (15), rather, the quencher concentration is an optical intensity-dependent spatial distribution given by $$B_0(x,y)=[BASE]\exp[-C_{Dill,Base}I(x,y)], \quad (17)$$

where [BASE] is the initial quencher base concentration before photo-exposure, and $C_{Dill,Base}$ is a "Dill C" parameter representing the rate of photo-absorption and photo-decomposition of the quencher base under photo-exposure. Consequently, equations (15) and (16) may be augmented and physically rationalized as:

$$H(x,y)=\max\{G_H(x,y)*\max[H_0(x,y)-B_0(x,y),0]-G_B(x,y) \\ *\max[B_0(x,y)-H_0(x,y),0],0\}, \quad (18)$$

$$M(x,y)=\exp[-C_{CAR}H(x,y)]=\exp[-C_{CAR}\times\max\{G_H(x,y) \\ *\max[H_0(x,y)-B_0(x,y),0]-G_B(x,y)*\max[B_0(x,y)-H_0(x,y),0],0\}], \quad (19)$$

with $B_0(x,y)$ defined as in equation (17).

The combination of equations (17), (18), and (19) provides one compact and efficiently computable modeling term entering equation (5) as the model signal, which is physically rationalized to represent the inhibitor concentration after the steps of photo-exposure and PEB. Therefore in one embodiment the inhibitor concentration includes a natural exponential function of a photo-acid concentration disposed in the photoresist.

In one embodiment, the photo-acid concentration H(x,y) in equation (12) or (15) incorporates another modeling term that is physically rationalized to represent the so-called "chemical flare" effect, which refers to the transfer of photo-acid from high concentration regions to relatively low concentration regions, via the complex process of gaseous flow of photo-acid out of the photoresist film into the chamber of the PEB oven, gaseous diffusion in the chamber of the PEB oven, and subsequent re-deposition onto and being absorbed back into the photoresist film. It is physically rationalized that the gaseous diffusion leads to a larger diffusion length, therefore, a modeling term $$\Delta H(x,y)=G_{ChemicalFlare}(x,y)*\max[C_{Dill}I(x,y)-B_0(x,y),0] \quad (20)$$

or $$\Delta H(x,y)=G_{ChemicalFlare}(x,y)*\max[H_0(x,y)-B_0(x,y),0] \quad (21)$$

may be incorporated into H(x,y) in equation (12) or (15) additively, where the Gaussian convolution kernel $G_{ChemicalFlare}(x,y)$ has a diffusion length that is substantially larger than that of $G_H(x,y)$, reflecting the gaseous diffusion nature of "chemical flare". Similarly, there is also a "chemical flare" effect for the quencher base, referring to the often longer-ranged diffusion of quencher base via the steps of gaseous out-flow from the photoresist film, gaseous diffusion, and re-deposition back into the photoresist film of quencher base. Such "chemical flare" effect of the quencher base is similarly physically rationalized into a modeling term:

$$\Delta B(x,y) = G'_{ChemicalFlare}(x,y) * \max[B_0(x,y) - C_{Dill}I(x,y), 0], \quad (22)$$

or $$\Delta B(x,y) = G'_{ChemicalFlare}(x,y) * \max[B_0(x,y) - H_0(x,y), 0], \quad (23)$$

where the Gaussian convolution kernel $G'_{ChemicalFlare}(x,y)$ has a diffusion length that is substantially larger than that of $G_B(x,y)$, reflecting the gaseous diffusion nature of "chemical flare" associated with the quencher base. The physically rationalized modeling terms $\Delta H(x,y)$ and $\Delta B(x,y)$ may be incorporated into, for example, equation (19) as additive terms to $H(x,y)$, so to obtain a physically rationalized modeling term for the inhibitor concentration:

$$M(x,y) = \exp\{-C_{CAR} \times [H(x,y) + \Delta H(x,y) - \Delta B(x,y)]\}, \quad (24)$$

with $H(x,y)$, $\Delta H(x,y)$, and $\Delta B(x,y)$ defined in equations (18), (20) or (21), and (22) or (23) respectively. The physically rationalized modeling term of $M(x,y)$ of equation (24) in turn enters the physics-based compact model form of equation (5).

In still another embodiment, the effect of time-varying and photoresist opening aperture size-dependent development rate for the lower portion of the photoresist film closer to the wafer substrate is identified. The development rate may be analyzed in accordance with the mass transport limitation, namely, limited rates of mass transport for development agents from the bulk of the developer solution to the lower portion of the photoresist film through the already-opened apertures in the photoresist film, and for dissolved photoresist materials to flow out of the apertures and into the bulk of the developer solution.

Physically, it is rationalized that the mass transport-limited development rate should be a product of the bulk development rate $R(M)$ and the aperture-size limited rate of mass transport $R'[A(x,y)]$, with $A(x,y)$ being an aperture density function, representing the effective aperture size as seen by a point $(x,y)$ in the lower portion of the photoresist film. Practically, an aperture density function can be obtained by convolving the intended photoresist pattern or simulated developed photoresist contours in the top portion of the photoresist film with a suitable weighting kernel, which represents a weighted area of photoresist opening aperture in the upper portion of the photoresist film with respect to the point $(x,y)$ in the lower portion of the photoresist film.

Alternatively, the aperture density function may be computed as a weighted integration over the area of the intended photoresist pattern or simulated developed photoresist contours in the top portion of the photoresist film that is "visible" to the point $(x,y)$ in the lower portion of the photoresist film, namely, the weighted integration accumulates weighted area only over locations of photoresist opening that are connected with the point $(x,y)$ through a "line of sight." Therefore, any location of photoresist opening that has the straight line pointing to the point $(x,y)$ obstructed by undeveloped photoresist may not contribute to the weighted integration.

The physical rationalization of the weighted integration of "line of sight" areas is that the mass transport processes enabling and affecting the process of photoresist development is dominated by "line of sight" transport of chemical species. When the aperture limitation effect is not severe, it is reasonable to expand the rate of mass transport $R'[A(x,y)]$ as a low-order polynomial:

$$R'[A(x,y)] = R'_0 - R'_1 A(x,y) + R'_2 [A(x,y)]^2 + \quad (25)$$

With the second- and higher-order terms in equation (25) neglected, the mass transport-limited development rate reads:

$$R'[A(x,y)]R[M(x,y)] = R'_0 R[M(x,y)] - R'_1 A(x,y) R[M(x,y)]. \quad (26)$$

The first term on the right-hand side of equation (26) coincides with the physically rationalized modeling term of variable bias as given by equation (11), whereas the second term on the right-hand side of equation (26), when combined with equations (6), (7), and (10), produces another physically rationalized modeling term of variable bias $$\Delta M_2(x,y) = -C \times A(x,y) \times |\nabla M(x,y)| \times [M(x,y)]^n, \quad (27)$$

which represents the photoresist aperture-induced development bias, and enters equation (5) as another additive term to the $\Delta M(x,y)$ collection of variable biases.

Figure 6:
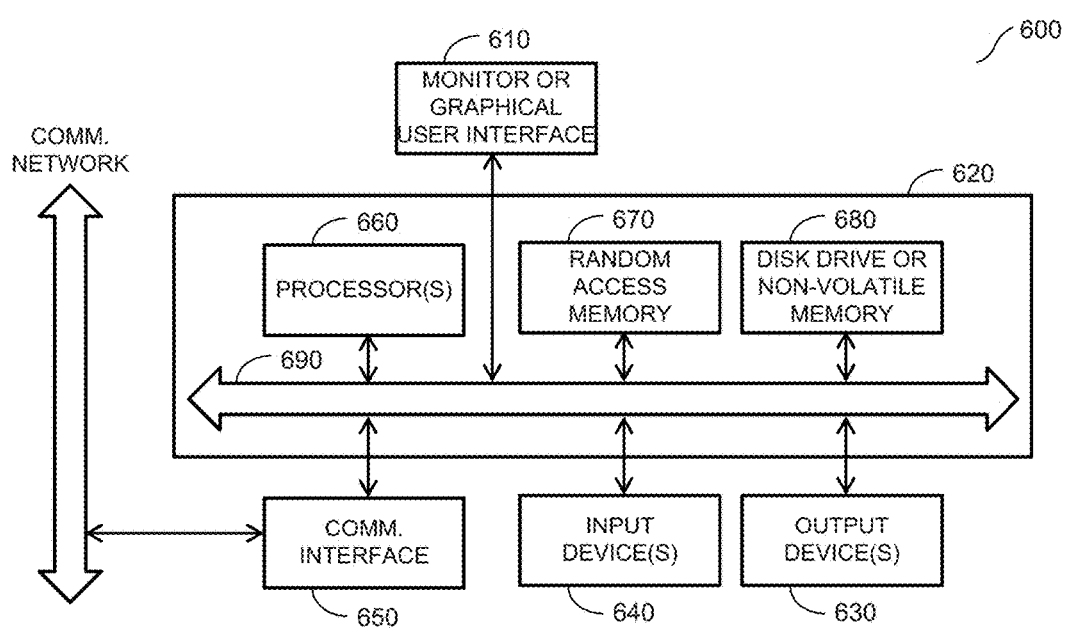
FIG. 6 is a block diagram of a computer system that may incorporate embodiments of the present invention.

FIG. 6 is a block diagram of a computer system that may incorporate embodiments of the present invention. FIG. 6 is merely illustrative of an embodiment incorporating the present invention and does not limit the scope of the invention as recited in the claims. One of ordinary skill in the art would recognize other variations, modifications, and alternatives.

In one embodiment, computer system 600 typically includes a monitor 610, a computer 620, user output devices 630, user input devices 640, communications interface 650, and the like.

As shown in FIG. 6, computer 620 may include a processor(s) 660 that communicates with a number of peripheral devices via a bus subsystem 690. These peripheral devices may include user output devices 630, user input devices 640, communications interface 650, and a storage subsystem, such as random access memory (RAM) 670 and disk drive 680.

User input devices 630 include all possible types of devices and mechanisms for inputting information to computer system 620. These may include a keyboard, a keypad, a touch screen incorporated into the display, audio input devices such as voice recognition systems, microphones, and other types of input devices. In various embodiments, user input devices 630 are typically embodied as a computer mouse, a trackball, a track pad, a joystick, wireless remote, drawing tablet, voice command system, eye tracking system, and the like. User input devices 630 typically allow a user to select objects, icons, text and the like that appear on the monitor 610 via a command such as a click of a button or the like.

User output devices 640 include all possible types of devices and mechanisms for outputting information from computer 620. These may include a display (e.g., monitor 610), non-visual displays such as audio output devices, etc.

Communications interface 650 provides an interface to other communication networks and devices. Communications interface 650 may serve as an interface for receiving data from and transmitting data to other systems. Embodiments of communications interface 650 typically include an Ethernet card, a modem (telephone, satellite, cable, ISDN), (asynchronous) digital subscriber line (DSL) unit, FireWire interface, USB interface, and the like. For example, communications interface 650 may be coupled to a computer network, to a FireWire bus, or the like. In other embodiments, communications interfaces 650 may be physically integrated on the motherboard of computer 620, and may be a software program, such as soft DSL, or the like.

In various embodiments, computer system 600 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 620 includes one or more Xeon microprocessors from Intel as processor(s) 660. Further, one embodiment, computer 620 includes a UNIX-based operating system.

RAM 670 and disk drive 680 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 670 and disk drive 680 may be configured to store the basic programming and data constructs that provide the functionality of the present invention.

Software code modules and instructions that provide the functionality of the present invention may be stored in RAM 670 and disk drive 680. These software modules may be executed by processor(s) 660. RAM 670 and disk drive 680 may also provide a repository for storing data used in accordance with the present invention.

RAM 670 and disk drive 680 may include a number of memories including a main random access memory (RAM) for storage of instructions and data during program execution and a read only memory (ROM) in which fixed non-transitory instructions are stored. RAM 670 and disk drive 680 may include a file storage subsystem providing persistent (non-volatile) storage for program and data files. RAM 670 and disk drive 680 may also include removable storage systems, such as removable flash memory.

Bus subsystem 690 provides a mechanism for letting the various components and subsystems of computer 620 communicate with each other as intended. Although bus subsystem 690 is shown schematically as a single bus, alternative embodiments of the bus subsystem may utilize multiple busses.

FIG. 6 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above embodiments of the present invention are illustrative and not limiting. Various alternatives and equivalents are possible. Although, the invention has been described with reference to inhibitor concentration by way of an example, it is understood that the invention is not limited by the inhibitor concentration but may also be applicable to model forms based on a different physical or mathematical quantity as the model signal such as the optical intensity, the photo-acid concentration, the chemically amplified inhibitor de-blocking concentration or its complement, a resist development solubility measure depending on the photo-acid concentration or the optical intensity directly, and ultimately the spatial distribution of resist development time. In addition, the technique and system of the present invention is suitable for use with a wide variety of electronic design automation (EDA) tools and methodologies for designing, testing, and/or manufacturing systems characterized by a combination of conserved, signal flow, and event or digital system of equations. The scope of the invention should, therefore, be determined not with reference to the above description, but instead should be determined with reference to the pending claims along with their full scope or equivalents.

What is claimed is:

1. A computational lithography tool executing on a computer for development, analysis, characterization, refinement, and implementing a semiconductor process, the computational lithography tool configured to;

model, using the computer, a photoresist profile in accordance with a magnitude of a gradient of an inhibitor concentration disposed in the photoresist, said model defined by a threshold of an inhibitor disposed in the photoresist that is equal to at least the sum of a first term and a second term, wherein the first term includes an inhibitor concentration and the second term includes a magnitude of the gradient of the inhibitor concentration, when the computational lithography tool is invoked to develop, analyze, characterize, refine, and implement the semiconductor process using the photoresist to form an integrated circuit.

2. The computational lithography tool of claim 1, wherein the inhibitor concentration comprises an exponential function of a photo-acid concentration disposed in the photoresist.

3. The computational lithography tool of claim 1 further configured to model, using the computer, the photoresist profile in accordance with the inhibitor concentration raised to a power of n, wherein n is a real number greater than or equal to 5.

4. The computational lithography tool of claim 1 further configured to apply the modeled photoresist profile to reduce a distortion in a printed photoresist pattern caused by a response of the photoresist to an electromagnetic wave and/or particle beam during the semiconductor process.

5. The computational lithography tool of claim 1, wherein the second term includes the product of the magnitude of the gradient of the inhibitor concentration multiplied by the inhibitor concentration raised to a power of n, wherein n is a real number greater than or equal to 5.

6. The computational lithography tool of claim 1, wherein the first term includes an exponential function of a photo-acid concentration disposed in the photoresist.

7. The computational lithography tool of claim 1, wherein the second term includes the sum of a third term and a fourth term.

8. The computational lithography tool of claim 7, wherein the third term includes the product of the magnitude of the gradient of the inhibitor concentration multiplied by the inhibitor concentration raised to a power of n, wherein n is a real number greater than or equal to 5.

9. A non-transitory computer-readable storage medium comprising instructions which when executed by a computational lithography tool cause the computational lithography tool to model a photoresist profile in accordance with a magnitude of a gradient of an inhibitor concentration disposed in the photoresist, said model defined by a threshold of an inhibitor disposed in the photoresist that is equal to at least the sum of a first term and a second term, wherein the first term includes an inhibitor concentration and the second term includes a magnitude of the gradient of the inhibitor concentration, when the computational lithography tool is invoked to develop, analyze, characterize, refine, and implement the semiconductor process using the photoresist to form an integrated circuit.

10. The non-transitory computer-readable storage medium of claim 9, wherein the inhibitor concentration comprises an exponential function of a photo-acid concentration disposed in the photoresist.

11. The non-transitory computer-readable storage medium of claim 9, the instructions further causing the computational lithography tool to model the photoresist profile in accordance with the inhibitor concentration raised to a power of n, wherein n is a real number greater than or equal to 5.

12. The non-transitory computer-readable storage medium of claim 9, the instructions further causing the computational lithography tool to apply the modeled photoresist profile to reduce a distortion in a printed photoresist pattern caused by a response of the photoresist to an electromagnetic wave and/or particle beam during the semiconductor process.

13. The non-transitory computer-readable storage medium of claim 9, wherein the second term includes the product of the magnitude of the gradient of the inhibitor concentration multiplied by the inhibitor concentration raised to a power of n, wherein n is a real number greater than or equal to 5.

14. The non-transitory computer-readable storage medium of claim 9, wherein the first term includes an exponential function of a photo-acid concentration disposed in the photoresist.

15. The non-transitory computer-readable storage medium of claim 9, wherein the second term includes the sum of a third term and a fourth term.

16. The non-transitory computer-readable storage medium of claim 15, wherein the third term includes the product of the magnitude of the gradient of the inhibitor concentration multiplied by the inhibitor concentration raised to a power of n, wherein n is a real number greater than or equal to 5.

17. A system configured to model a photoresist profile in accordance with a magnitude of a gradient of an inhibitor concentration disposed in the photoresist, said model defined by a threshold of an inhibitor disposed in the photoresist that is equal to at least the sum of a first term and a second term, wherein the first term includes an inhibitor concentration and the second term includes a magnitude of the gradient of the inhibitor concentration, when the system is invoked to develop, analyze, characterize, refine, and implement the semiconductor process using the photoresist to form an integrated circuit.

18. The system of claim 17, wherein the inhibitor concentration comprises an exponential function of a photo-acid concentration disposed in the photoresist.

19. The system of claim 17 further configured to model the photoresist profile in accordance with the inhibitor concentration raised to a power of n, wherein n is a real number greater than or equal to 5.

20. The system of claim 17 further configured to apply the modeled photoresist profile to reduce a distortion in a printed photoresist pattern caused by a response of the photoresist to an electromagnetic wave and/or particle beam during the semiconductor process.

21. The system of claim 17, wherein the second term includes the product of the magnitude of the gradient of the inhibitor concentration multiplied by the inhibitor concentration raised to a power of n, wherein n is a real number greater than or equal to 5.

22. The system of claim 17, wherein the first term includes an exponential function of a photo-acid concentration disposed in the photoresist.

23. The system of claim 17, wherein the second term includes the sum of a third term and a fourth term.

24. The system of claim 23, wherein the third term includes the product of the magnitude of the gradient of the inhibitor concentration multiplied by the inhibitor concentration raised to a power of n, wherein n is a real number greater than or equal to 5.

* * * * *